(12) United States Patent
Ikku

(10) Patent No.: US 6,888,149 B2
(45) Date of Patent: May 3, 2005

(54) FOCUSED ION BEAM APPARATUS

(75) Inventor: Yutaka Ikku, Chiba (JP)

(73) Assignee: Seiko Instruments Inc., Chiba (JP)

( * ) Notice: Subject to any disclaimer, the term of this patent is extended or adjusted under 35 U.S.C. 154(b) by 26 days.

(21) Appl. No.: 10/436,896

(22) Filed: May 13, 2003

(65) Prior Publication Data

US 2004/0011964 A1 Jan. 22, 2004

(30) Foreign Application Priority Data

May 14, 2002 (JP) .................................. 2002-138506

(51) Int. Cl.[7] .................................................. G01J 1/00
(52) U.S. Cl. ............................... 250/491.1; 250/492.2; 250/492.23
(58) Field of Search ........................ 250/491.1, 492.2, 250/492.23, 492.22, 492.3

(56) References Cited

U.S. PATENT DOCUMENTS

| 5,134,298 A | * | 7/1992 | Inagaki et al. | ........... 250/491.1 |
| 5,776,645 A | * | 7/1998 | Barr et al. | ................. 430/22 |
| 5,965,895 A | * | 10/1999 | Satoh et al. | ............. 250/491.1 |
| 6,573,516 B2 | * | 6/2003 | Kawakami | ............ 250/492.21 |
| 6,593,583 B2 | * | 7/2003 | Iwasaki | .................. 250/492.1 |

FOREIGN PATENT DOCUMENTS

JP          63-305358          12/1988

* cited by examiner

Primary Examiner—John R. Lee
Assistant Examiner—Anthony Quash
(74) Attorney, Agent, or Firm—Hogan & Hartson, LLP

(57) ABSTRACT

A method for correcting drifts in beam irradiation position in a focused ion beam apparatus is disclosed. A linear line pattern is formed on a sample by linearly irradiating a focused ion beam at a location removed from a processing region where a cross section is to be formed in the sample. The linear line pattern extends in a direction in parallel with a surface of the cross section to be formed. By referring to the linear line pattern while a specified section of the sample is processed, the beam irradiation position of the focused ion beam with respect to the linear line pattern is measured in a direction perpendicular to the linear line pattern to detect a drift in the beam irradiation position of the focused ion beam in the direction perpendicular to the linear line pattern. The beam irradiation position of the focused ion beam is corrected based on the drift detected with respect to the processing region.

19 Claims, 5 Drawing Sheets

FOCUSED ION BEAM APPARATUS

BACKGROUND OF THE INVENTION

1. Field of the Invention

The present invention generally relates to focused ion beam apparatuses, and more particularly to methods and devices for correcting beam irradiation positions in focused ion beam apparatuses, which overcomes the problems associated with a fine processing that employs ion beam irradiation in which an irradiated position of ion beam may shift during the fine processing.

2. Related Background Art

When a fine processing is conducted through irradiation of an ion beam, the irradiated position (or focused position) of the ion beam may shift due to a variety of factors, which may often make it difficult to conduct a specified fine processing. In particular, due to further miniaturization in the semiconductor device design rule, the positional accuracy that is required in a fine processing has reached a level of 100 nm or below. In order to realize such a positional accuracy, the amount of drift, i.e., a shift of irradiation position, during a fine processing needs to be restricted to about one length (1/10) of the positional accuracy or less, which is about 10 nm or less.

In order to solve the problem of drifts of irradiation position during fine processings, improvements in terms of hardware have been made to reduce the amount of drift. However, the improvement in hardware has its limitation. Accordingly, methods that involve detection of the amount of drift to correct the beam irradiation position are commonly practiced.

The methods generally employ pattern matching techniques with image processing, by which the amount of drift can be detected through pattern matching of reference regions. However, in the fine processing that uses a focused ion beam, a series of fine proceedings are conducted through changing beam currents to be irradiated on a sample (which may be referred hereafter to as the "sample irradiation beam currents) for a rough processing, an intermediate processing and a finish processing. In order to change the sample irradiation beam currents, the aperture diameter of a variable aperture stop, which is one of components of the focused ion lens system, may be changed, or the ion lens condition may be changed. However, the changes in the conditions would change the position of sample irradiation beam. Accordingly, an image of the entire sample needs to be taken again for such a change in the focused lens system, and the beam irradiation position needs to be reset.

Also, when the sample irradiation beam current is increased, the beam diameter becomes larger, and an image obtained becomes more obscure compared to an image obtained when the sample irradiation beam current is small. Further, depending on samples, when the sample irradiation beam current is increased, a localized charge-up phenomenon occurs such that the brightness/contrast may also change. Accordingly, when a series of fine processings are performed through changing the sample irradiation beam current, it is difficult to correct drifts by the pattern matching technique. To overcome this difficulty, there has been proposed a pattern correction method in which reference patterns in dots are formed, and positions of the dots are referred to during the proceedings, and irradiation positions to be processed are corrected.

However, the conventional pattern correction method entails the following problems in forming the reference patterns in dots. One of the problems is that samples may not often have a flat surface on which dot patterns are formed. In this case, it is difficult to discriminate roughness (i.e., concave sections and convex sections) that are originally present on the sample surface from the dots formed. Accordingly, prior to forming dotted patterns on the surface of the sample, a deposition film needs to be formed by flowing a specified gas in areas adjacent to the dot patterns to be formed and irradiating a beam on the sample, and then the dot patterns need to be formed on the deposition film. The deposition film can cover up the roughness on the surface of the sample that is originally present on the sample.

While processing a specified region, the processing work may be stopped occasionally, and a reference pattern region where the dot patterns are formed is scanned and the amount of drift is measured. However, after repeatedly scanning the reference pattern region, the deposition film is finally etched, and the original surface roughness of the sample may possibly reveal. In order to prevent this incident, a thick deposition film needs to be formed. For example, when it takes 20 seconds to form a dot pattern, it would take 2 minutes to form a deposition film prior to forming the dot pattern.

Also, in measuring the amount of drift through recognizing the dot patterns, locations of the dots are obtained by image processing. However, when the dots are small, only a few of the dots have brightness recognizably different from that of the surrounding, in other words, there are only a few specific points. In measuring positions of the dots, the required measurement accuracy needs to be high enough to recognize a size smaller than a pixel size of an image that is obtained. However, when there are a few specific points with brightness recognizably different from that of the surrounding, the accuracy in measuring positions cannot be increased to a required level. If the size of each dot is enlarged, the measurement accuracy may improve as the number of specific points in a specified group increases. However, when the reference pattern region is scanned to obtain a reference pattern image, the entire group of the specific points may not possibly be contained inside the image area obtained by scanning the reference pattern region if the amount of drift is large. The amount of drift cannot be accurately measured without recognizing all of the specific points in the group. Otherwise, the accuracy in measuring positions may have to be sacrificed to a degree, and drift allowances may be increased if these specific points are to be used in measuring the amount of drift. The balance between the accuracy in measuring positions and the drift allowances must be taken into consideration to realize an appropriate drift correction state. For this reason, even when the creation of dot patterns is automated so that an operator can preset processing conditions, and dot patterns for drift correction are automatically created according to the preset processing conditions, it is difficult to guarantee if the drift correction operation is reliably performed.

When performing a cross-sectional processing or a transmission electron microscope (TEM) sample processing, a plurality of steps including a rough processing step, an intermediate processing step and a finish processing step are conducted. If the sample irradiation current of the focused ion beam is increased in order to increase the processing speed, the beam diameter of the focused ion beam becomes relatively large. In this case, a cross section that is formed by the processing becomes to have a slanted surface, in other words, does not become to be vertical (i.e., perpendicular) with respect to the plane surface of the sample. To obtain a vertical cross section, the sample irradiation current is gradually lowered in steps, in other words, the beam diameter is gradually reduced in steps toward finishing the vertical surface. However, when the sample irradiation current of the focused ion beam is switched from one step to another, the beam irradiation position change with respect to the sample. Accordingly, the irradiation position of the focused ion beam needs to be corrected at each step.

SUMMARY OF THE INVENTION

In accordance with an embodiment of the present invention, a linear line pattern is formed on a sample by linearly irradiating an ion beam on the sample. While a fine processing is performed on a specified region, the linear line pattern is observed. In one aspect of the present embodiment, brightness changing positions along the linear line pattern are measured from one side of the linear line pattern in one direction perpendicular to an extension direction of the linear line pattern, and brightness changing positions along the linear line pattern are also measured from another side (e.g., an opposite side) of the linear line pattern in another direction (e.g., an opposite direction) perpendicular to the extension direction of the linear line pattern. Average position of both of the measured brightness changing positions is obtained; and based on the average position, a beam irradiation position in the direction perpendicular to the extension direction of the linear line pattern is measured. In this measurement, drifts that appear only in the direction perpendicular to the extension direction of the linear line pattern may be corrected. However, accurate measurements can be performed since the brightness changing points are linearly continuous.

When a sample irradiation current is increased, the thickness (i.e., the width) of the straight line segment of the linear line pattern becomes to be greater, and its image also becomes thicker (i.e., wider). However, one side and the other side of the straight line segment of the linear line pattern about a center line of the pattern in the image are broadened by the same amount in both ways in directions perpendicular to the extension direction of the straight line. Accordingly, by using the average position of the measured positions of the straight line taken from the mutually opposite directions perpendicular to the straight line segment, the position of the focused ion beam in the direction perpendicular to the linear line pattern, which does not depend on the sample irradiation current at the time of forming the linear line pattern, can be more accurately determined. As a result, even when the sample irradiation current changes, in other words, even when the thickness of the linear line pattern changes, the irradiation position of the focused ion beam can be accurately corrected.

The obtained amount of drift to be corrected represents a drift component only in a direction perpendicular to the extension direction of the linear line pattern; in other words, drifts are corrected only in one direction.

In general, one of the main objects of the fine processing is to form a cross section in a sample for observation of the cross section, or to create a TEM sample. In this case, to achieve the object, drifts in a direction perpendicular to the cross section to be formed need to be accurately corrected. However, some drifts may be permitted in a direction in parallel with the cross section to be formed. A focused ion beam apparatus may intrinsically have drifts, but in accordance with one embodiment of the present invention, a method for correcting a beam irradiation position in fine processing with such a focused ion beam apparatus may allow some drifts of the focused ion beam apparatus in a direction in parallel with a cross section to be created, and correct drifts only in at least one direction with respect to the cross section to be created, preferably in a direction perpendicular to the cross section to be created, which requires more strict drift control. Accordingly, the method for correcting a beam irradiation position in fine processing in accordance with the present embodiment gives attention to the fact that the required accuracy level for drift correction differs depending on directions with respect to a cross section to be created, and may obtain a drift correction amount only in at least one direction with respect to a cross section to be created. The embodiment of the present invention is effective in realizing a highly accurate drift correction only in a specified direction that requires a higher drift correction accuracy.

In one aspect of the present embodiment, since brightness changing points are linearly continuous due to the fact that a linear line pattern is formed on a sample surface, the recognition of the pattern can be facilitated. For example, an algorithm that searches maximum brightness changing points in a direction perpendicular to the formed linear line may be used to create a linear line recognition algorithm that successively obtains maximum brightness changing points along the linear line pattern and determines as to whether or not a row of the points thus obtained is linearly continuous. With such a simple linear line recognition algorithm, the linear line pattern can be readily recognized even when the sample surface has roughness, and the need for forming a deposition film is obviated.

Brightness information may be integrated in a direction of the linear line pattern to obtain one brightness profile in a direction perpendicular to the linear line pattern. Even when the sample surface has some roughness, the brightness profile shows few brightness changes in regions outside of is the linear line pattern and maximum brightness changes within the linear line pattern due to the affect of the integration, such that the position of the linear line can be readily obtained based on the brightness profile. As a result, the position of the linear line can be measured without the need to form a deposition film. Because there is no need to form a deposition film, the processing time required to form a reference pattern can be shortened. The short processing time required to form a reference pattern is effective at least in the following aspects.

The short processing time improves the operability of the focused ion beam apparatus. Prior to a fine processing on a sample, a sample image of the sample is obtained and various settings are made (for example, various processing frames are set) for the fine processing. Then, a reference pattern in a linear line configuration may be automatically formed at a position where a relative positional relation with a position of a section in the sample that is subject to the fine processing is preset. During the fine processing work, the reference pattern is periodically observed, drifts of the beam irradiation position are measured through recognizing the linear line pattern, and the drifts of the beam irradiation position can be corrected with respect to the section in the sample that is subject to the fine processing. The reference pattern can be formed in a substantially shorter time, and therefore the actual fine processing work can be started with a substantially shorter waiting time during which the reference pattern is formed. Therefore, an operator of the focused ion beam apparatus can readily use the drift correction function that limits correction of drifts only in at least one specified direction, without a substantial increase in the waiting time.

Secondly, the short processing time improves the accuracy in the position of fine processing. A drift of the beam irradiation position that may occur during a period between the start of fine processing and the completion of forming a reference pattern in a linear line configuration cannot be corrected. However, the amount of the drift during such a period can be ignored if the time for forming the reference pattern in a linear line configuration is short.

In accordance with another embodiment of the present invention, linear line patterns that do not overlap each other and extend orthogonal to each other may be formed on a sample. Positions of the beam irradiation position can be measured in directions perpendicular to extension directions of the two linear line patterns, in other words, drifts of the beam irradiation position in two directions orthogonal to each other can be measured, such that drift amounts on a rectangular coordinate system can be measured. Accordingly, the drift correction function in accordance with the present embodiment is widely applicable to any types of fine processings without being limited to a cross section formation or a TEM sample formation.

Other features and advantages of the invention will be apparent from the following detailed description, taken in conjunction with the accompanying drawings that illustrate, by way of example, various features of embodiments of the invention.

DESCRIPTION OF PREFERRED EMBODIMENTS

Preferred embodiments of the present invention will be described below with reference to the accompanying drawings.

Figure 1:
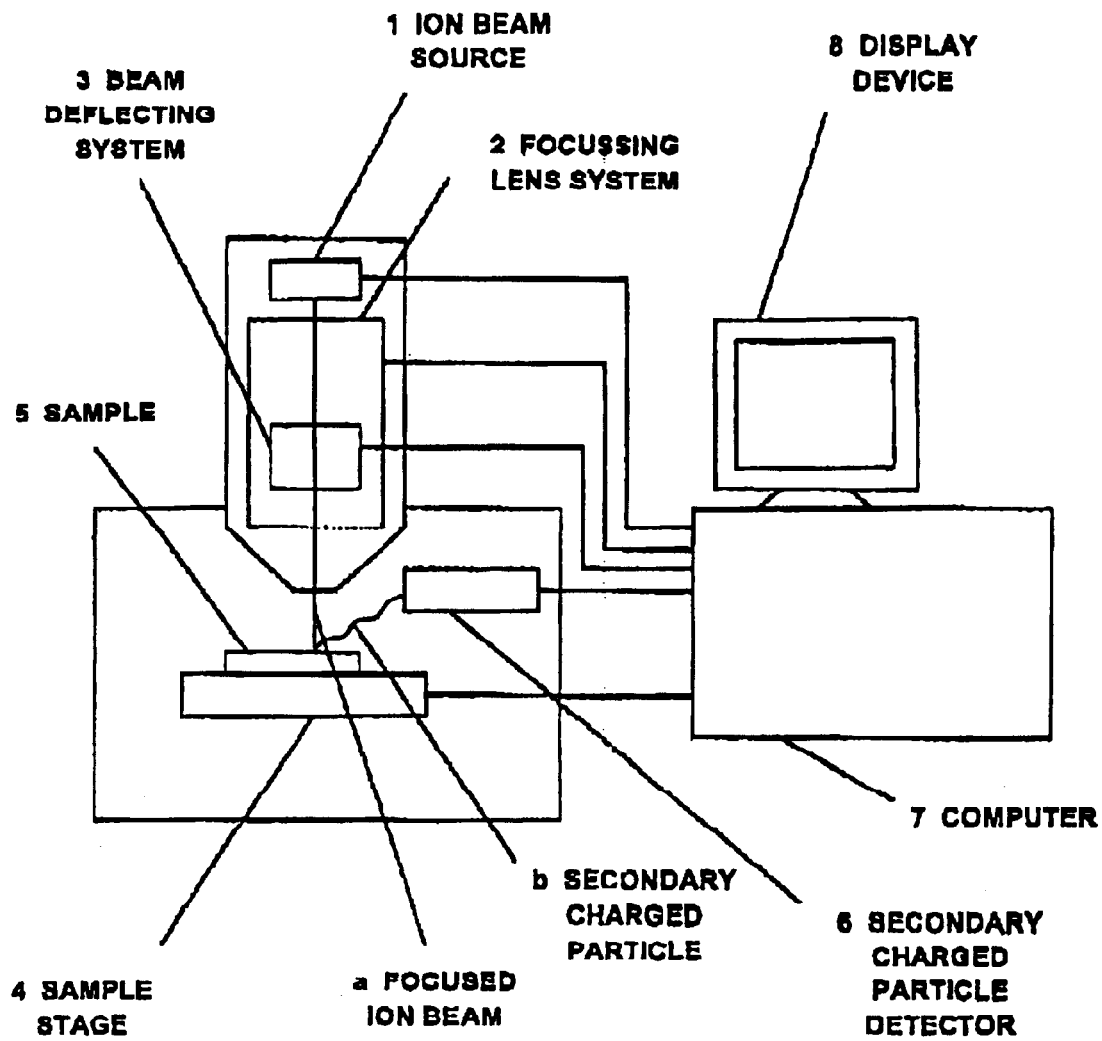
FIG. 1 schematically shows a system structure in accordance with an embodiment of the present invention.

FIG. 1 schematically shows a structure of a focused ion beam system in accordance with an embodiment of the present invention. The focused ion beam system includes a focused ion beam source 1 that generates an ion beam a. The ion beam a passes through a focusing lens system 2 and a beam deflection system 3, and is irradiated on a sample 5 that is mounted on a sample stage 4. When the ion beam a passes through the focusing lens system 2, the ion beam a is converged by the lens effect of the focusing lens system 2 and irradiated as a focused ion beam on the sample 5. The focusing lens system 2 includes a variable aperture switching function that provides a plurality of different aperture diameters. By changing settings at the focusing lens system 2, the beam current of the focused ion beam a irradiated on the sample 5 can be changed. Secondary charged particles b are generated by the irradiation. The generated secondary charged particles are detected by a secondary electron detector 6 and information for the intensity of the secondary charged particles is inputted in a computer 7. The beam deflection system 3 can shift the position of the focused ion beam a irradiated on the sample 4 in an x direction and y direction. The beam deflection system 3 is also controlled by the computer 7. Information for positions of the focused ion beam a, which is obtained through shifting the focused ion beam a in the x and y directions, and information for the intensity of the secondary charged particles are combined by the computer 7 to obtain image data for the sample 5.

The computer 7 may be equipped with functions to control the focused ion beam source 1, the focusing lens system 2, the beam deflection system 3 and the sample stage 4. In addition, the computer 7 may be equipped with a display device 8. The image data may be displayed in an specified region of the display device 8. Beside the image data, the display device 8 may display functional software buttons that ale required for various controls and operations of the focused ion beam apparatus.

Figure 2:
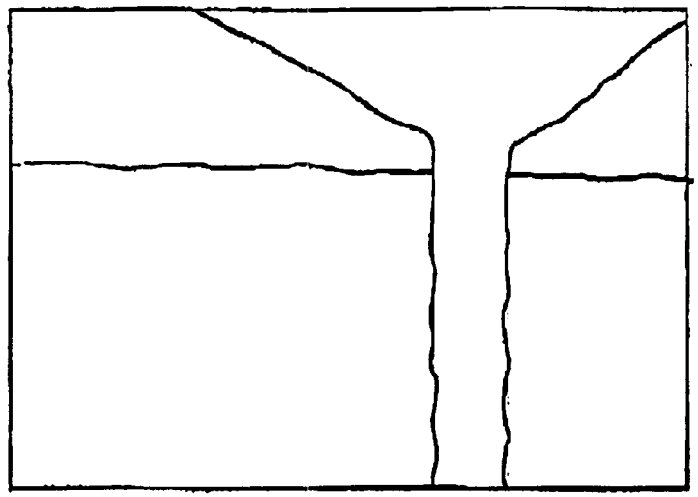
FIG. 2 shows a sample image displayed on a display device prior to a processing.

The sample stage 4 is operated to shift the sample 5 to a fine processing point. FIG. 2 shows an image data at the fine processing point displayed on the display device 8, which shows a sample image prior to the start of a fine processing.

Figure 3:
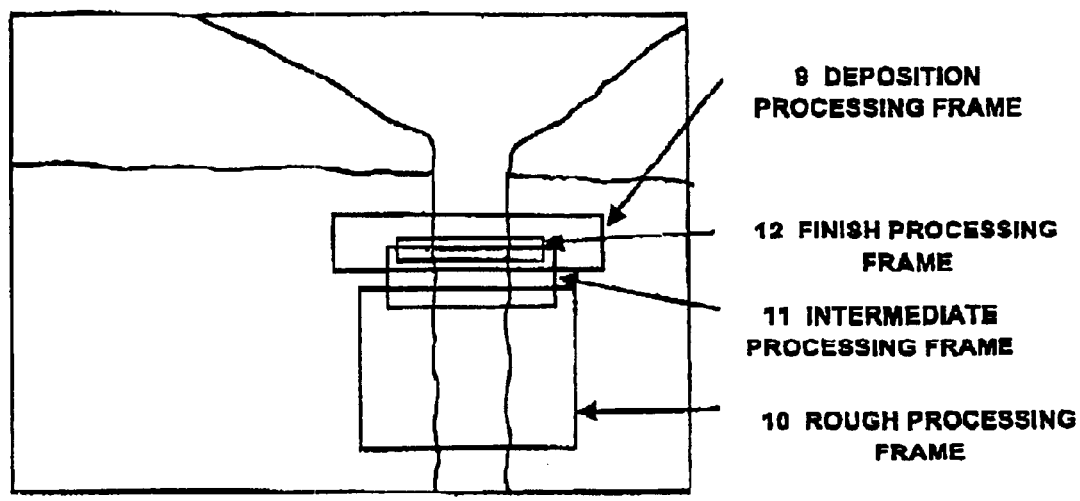
FIG. 3 shows an image in which processing conditions are inputted.

After the sample image is displayed on the display device 8, processing condition for the fine processing are set. FIG. 3 shows a processing condition input result in which a plurality of processing frames are set. Processing frames in this example mean processing regions where the fine processing is performed on the sample by irradiation of the focused ion beam. In this example, the processing frames illustrated in FIG. 3 are used for forming a cross section in the sample. It is noted that a plurality of processing frames are also inputted when a TEM sample in formed.

When a cross section is formed in the sample by drilling holes in the sample, a deposition film is at first formed on the sample surface. For this purpose, a deposition processing frame 9 is set. The deposition film is formed to protect a portion of the sample surface at a position where the cross section is formed.

Next, a rough processing frame 10 is set for forming larger holes in front of the cross section to be created. When a rough processing is conducted, the beam irradiation current is increased to shorten the processing time. However, when the beam irradiation current is increased, the beam diameter increases, and a clean vertical cross section cannot be formed. Accordingly, additional processing frames, such as, for example, an intermediate processing frame 11 and a finish processing frame 12 are set. The fine processing is conducted by gradually reducing the beam irradiation current in stages through the rough processing, the intermediate processing and the finish processing. In this example, a series of processing frames are set, and the finally formed cross section is located along an upper edge of a rectangle of the finish processing frame 12 in the figure. In the finish processing frame 12, the processing needs to be performed while the beam irradiation current is reduced to a lower level to reduce the beam diameter. Only by performing the processing in this manner, a clean vertical cross section can be formed. FIG. 3 shows a state in which all the conditions required for the series of processings have been set. In this example, each of the processing frames is manually inputted. However, in accordance with another embodiment, only the position of a finally formed cross section may be indicated by a linear line segment (for example, an upper edge of the finish processing frame 12 may be indicated by a linear line segment), and a series of processing frames may be automatically disposed.

Next, an actual formation of the cross section is started.

All operations at the start of formation of the cross section until its completion may be executed by the computer 7 in accordance with the present embodiment. The computer 7 may store a program that executes all of the operations. Accordingly, the program contains components that are required to execute the operations. In the present embodiment, all operations described below are executed by the computer 7.

Figure 4:
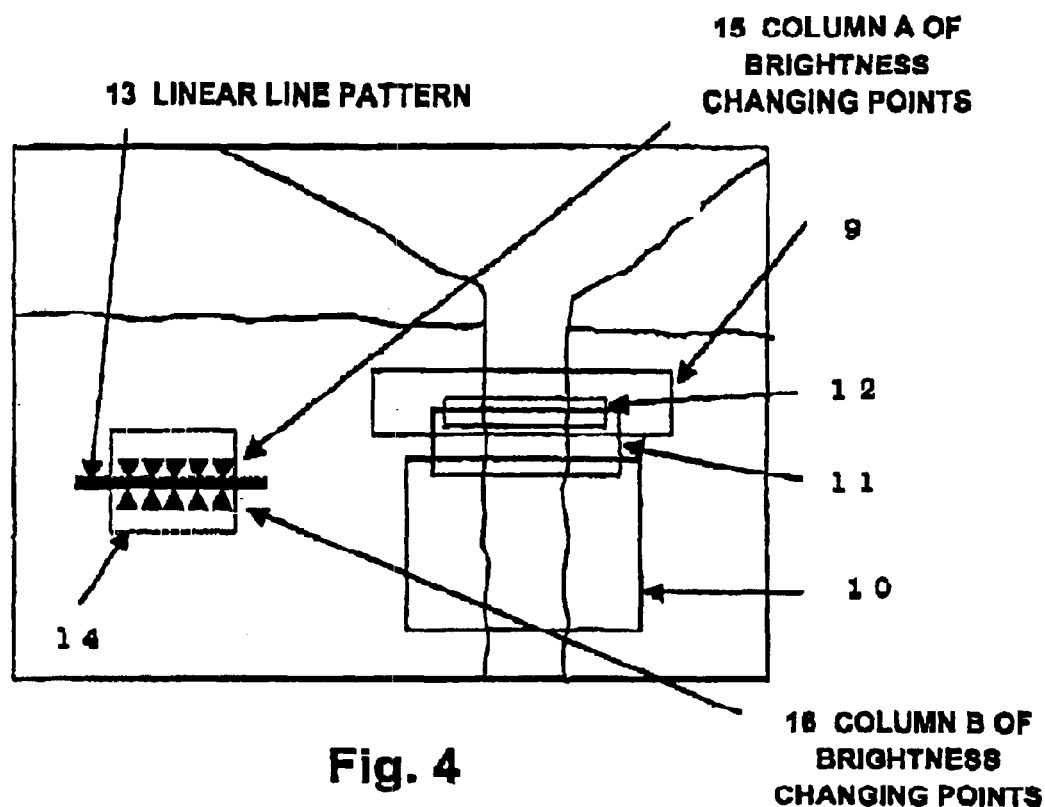
FIG. 4 shows a state in which a linear line pattern is formed.

At the beginning of the formation of the cross section in a sample, a linear line processing is conducted, in other words, a linear configuration processing line (hereafter referred to as a "linear line pattern) 13, which serves as a reference pattern, is formed. A finish processing position at which the cross section is formed is located along an upper side in the figure of the finish processing frame 12. The linear line pattern 13 is formed in parallel with the upper side of the finish processing frame 12 at a predetermined offset position removed from the finish processing position under predetermined conditions set at the focusing lens system 2. The processing time for forming the linear line pattern may be 10 seconds to 80 seconds. FIG. 4 shows a linear line configuration forming state in which the linear line processing is completed. The linear line pattern is registered as a reference pattern. After completing the linear line processing, the processing in the deposition processing frame 9 is conducted. For the processing in the deposition processing frame 9, beam irradiation conditions associated with the deposition processing frame 9 are set at the focusing lens system 2. After the setting of the beam irradiation conditions is completed, the position of the linear line pattern 13 in a direction perpendicular to the finish processing position is measured.

More specifically, an image for a region that includes the linear line pattern 13 is obtained as a linear line configuration search region 14. Brightness changing points in a row (a dot row A of brightness changing points) 15, as viewed from one side of the linear line pattern 13 in a direction perpendicular to the linear line pattern 18, are searched along an extension direction of the linear line pattern 13. Similarly, brightness changing points in a row (a dot row B of brightness changing points) 16, as viewed from another side of the linear line pattern 13 in a direction perpendicular to the linear line pattern 13, are searched along un extension direction of the linear line pattern 13. Then, a center position of the linear line segment is calculated by using the two dot rows. Then, the irradiation position of the focused ion beam a with respect to the calculated center position of the linear line segment of the linear line pattern 13 is measured.

Figure 5:
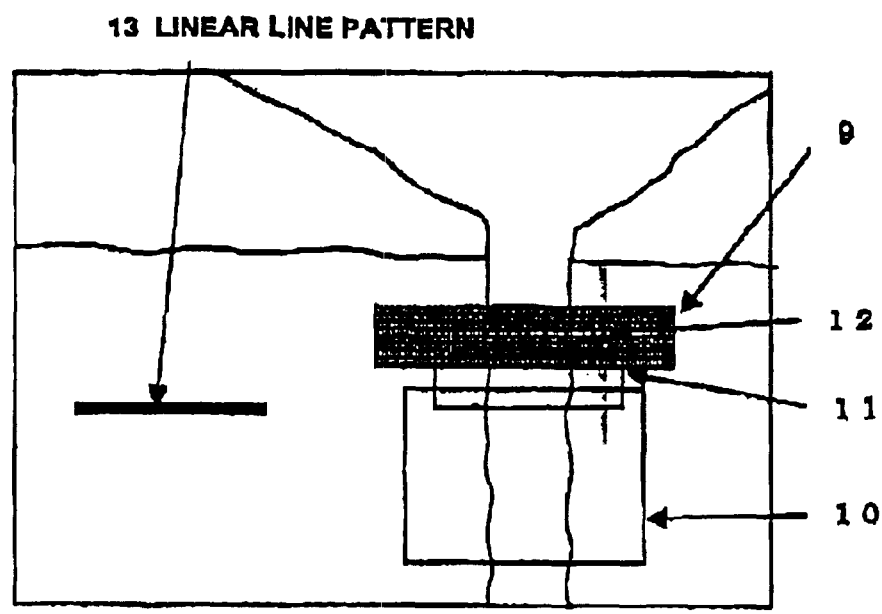
FIG. 5 shows a state in which a deposition film is being formed.

With the apparatus indicated in FIG. 1, a deposition film is formed through flowing a specific gas over the sample 5 and irradiating the focused ion beam a on the sample 5. A gas introduction system (not shown) is used to blow the specific gas onto the sample 5; and in this state, the beam deflection system 3 is controlled to irradiate the focused ion beam on an area of the sample 5 only within the deposition processing frame 9 to thereby form the deposition film. During the formation of the deposition film by irradiating the focused ion beam a within the deposition processing frame 9, the processing is periodically stopped, and the irradiation position of the focused ion beam a in the direction perpendicular to the linear line pattern 13 is measured. More specifically, the irradiation position of the focused ion beam a is measured with respect to the center position of the linear line segment of the linear line pattern 13 in the direction perpendicular to the linear line pattern 13. A difference between the currently measured irradiation position and the previously measured irradiation position corresponds to a drift amount. Based or the drift amount, the irradiation position of the focused ion beam a with respect to the deposition processing frame 9 is corrected in a direction perpendicular to the deposition processing frame 9. After the correction, the processing within the deposition processing frame 9 is restarted. As a result of the correction, when the deposition film is formed through scanning the focused ion beam a in a direction extending in parallel with the upper edge (in the direction of the cross section surface to be formed) of the deposition processing frame 9, the focused ion beam a is always irradiated at the same position in a direction perpendicular to the direction extending in parallel with the upper edge of the deposition processing frame 9. FIG. 5 shows a deposition processing state in which the deposition processing is being performed. In the deposition processing state, the deposition processing frame 9 is thinly shaded to mean that it is being used. When the processing within the deposition processing frame 9 is completed, the supply of the gas through the gas introduction system (not shown) is stopped, and the processing will be started within the rough processing frame 10.

To execute the processing in the rough processing frame 10, beam irradiation conditions associated with the rough processing frame 10 are set at the focusing lens system 2. When the setting of the beam irradiation conditions is completed, the irradiation position of the focused ion beam a in a direction perpendicular to the linear line segment of the linear line pattern 13 is measured. A difference between the currently measured irradiation position of the focused ion beam a in the direction perpendicular to the linear line segment and the previously measured irradiation position that was lastly measured in the processing in the deposition processing frame 9 corresponds to a drift amount that is caused by the change of the setting conditions at the focusing lens system 2. Based on the drift amount, the irradiation position of the focused ion beam a with respect to the rough processing frame 10 is corrected in a direction perpendicular to the rough processing frame 10.

Figure 6:
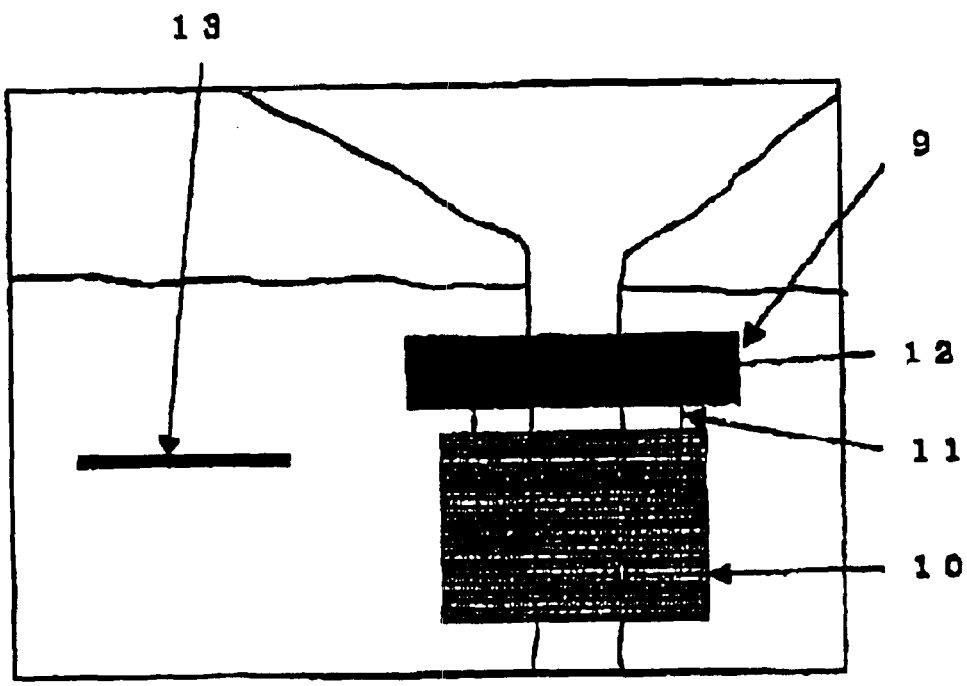
FIG. 6 shows a state in which a rough processing is being performed.

As a result of the correction, the focused ion beam a is irradiated at the same position on the sample 5 even after the beam irradiation conditions at the focusing lens system 2 have been changed. In this state, the beam deflection system 3 is controlled to irradiate the focused ion beam a on an area of the sample 5 only within the rough processing frame 10. During the processing within the rough processing frame 10, the processing is periodically stopped, and the irradiation position of the focused ion beam a in the direction perpendicular to the linear line pattern 18 is measured. A difference between the currently measured irradiation position and the previously measured irradiation position of the focused ion beam a in the direction perpendicular to the linear line pattern 13 corresponds to a drift amount. Based on the drift amount, the irradiation position of the focused ion beam a with respect to the rough processing frame 10 is corrected. After the correction, the processing within the rough processing frame 10 is restarted. As a result of the correction, when a trench is formed within the rough processing frame 10 through scanning the focused ion beam a in a direction extending in parallel with the upper edge (in the direction of the cross section surface to be formed) of the rough processing frame 10, the focused ion beam a is always irradiated at the same position in a direction perpendicular to the direction extending in parallel with the upper edge of the rough processing frame 10. FIG. 6 shows a rough processing state in which the rough processing is being performed. In the rough processing state shown in FIG. 6, the deposition processing frame 9 is darkly shaded to mean that it has already been used, and the rough processing frame 10 is thinly shaded to mean that it is being used.

When the processing within the rough processing frame 10 is completed, the processing in the intermediate processing frame 11 is started.

To execute the processing in the intermediate processing frame 11, beam irradiation conditions associated with the intermediate processing frame 11 are set at the focusing lens system 2. When the setting of the beam irradiation conditions is completed, the irradiation position of the focused ion beam a in a direction perpendicular to the linear line segment of the linear line pattern 13 is measured. A difference between the currently measured irradiation position of the focused ion beam a in the direction perpendicular to the linear line segment and the previously measured irradiation position that was lastly measured in the processing in the rough processing frame 10 corresponds to a drift amount that is caused by the change of the setting conditions at the focusing lens system 2. Based on the drift amount, the irradiation position of the focused ion beam a with respect to the intermediate processing frame 11 is corrected.

As a result of the correction, the focused ion beam a is irradiated at the same position on the sample 5 even after the beam irradiation conditions at the focusing lens system 2 have been changed. In this state, the beam deflection system 3 is controlled to irradiate the focused ion beam a on an area of the sample 5 only within the intermediate processing frame 11.

During the processing within the intermediate processing frame 11, the processing is periodically stopped, and the irradiation position of the focused ion beam a in the direction perpendicular to the linear line pattern 13 is measured.

A difference between the currently measured irradiation position and the previously measured irradiation position of the focused ion beam a in the direction perpendicular to the linear line pattern 13 corresponds to a drift amount. Based on the drift amount, the irradiation position of the focused ion beam a with respect to the intermediate processing frame 11 is corrected. After the correction, the processing within the intermediate processing frame 11 is restarted.

Figure 7:
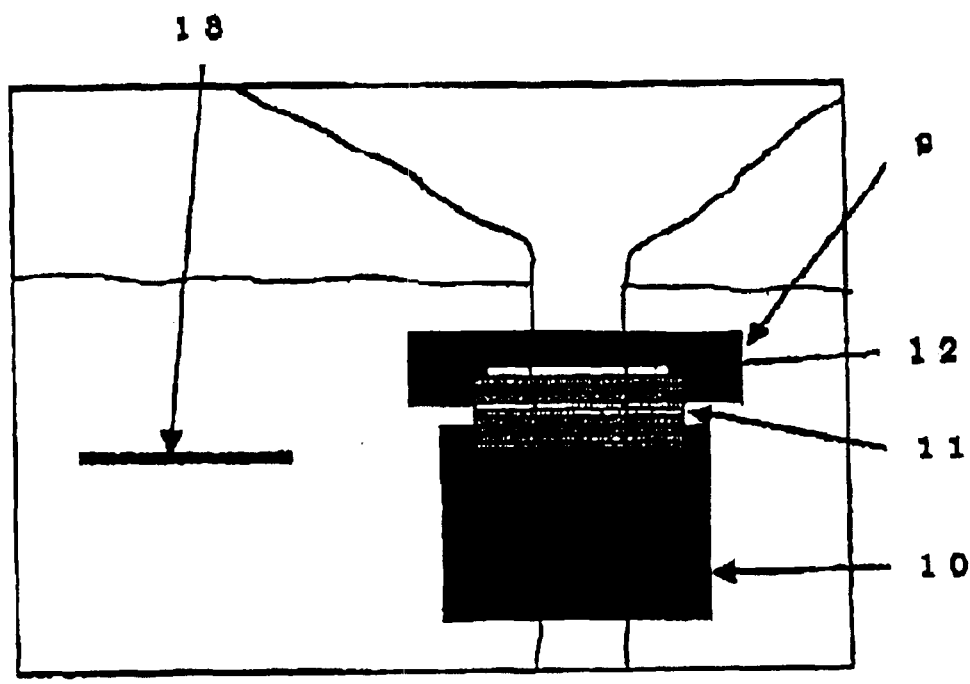
FIG. 7 shows a state in which an intermediate processing is being performed.

As a result of the correction, when a trench is formed within the intermediate processing frame 11 through scanning the focused ion beam a in a direction extending in parallel with the upper edge (in the direction of the cross section surface to be formed) of the intermediate processing frame 11, the focused ion beam a is always irradiated at the same position in a direction perpendicular to the direction extending in parallel with the upper edge of the intermediate processing frame 11. FIG. 7 shows an intermediate processing state in which the intermediate processing is being performed. In the intermediate processing state shown in FIG. 7, the deposition processing frame 9 and the rough processing frame 10 are darkly shaded to mean that they have already been used, and the intermediate processing frame 11 is thinly shaded to mean that it is being used.

Figure 8:
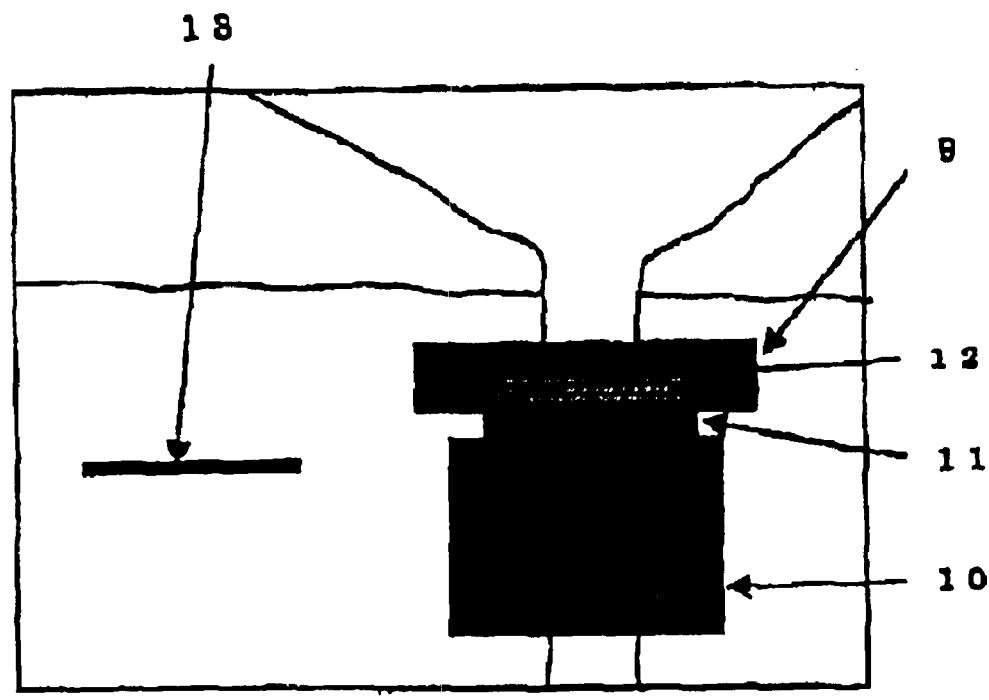
FIG. 8 shows a state in which a finish processing is being performed.

In a similar manner described above, the processing within the finish processing frame 12 is executed. FIG. 8 shows a finish processing state in which the finish processing is being performed. In the finish processing state shown in FIG. 8, the deposition processing frame 9, the rough processing frame 10 and the intermediate processing frame 11 are darkly shaded to mean that they have already been used, and the finish processing frame 12 is thinly shaded to mean that it is being used.

Upon completion of the processing within the finish processing fame 12, the formation of the cross section is completed.

Figure 9:
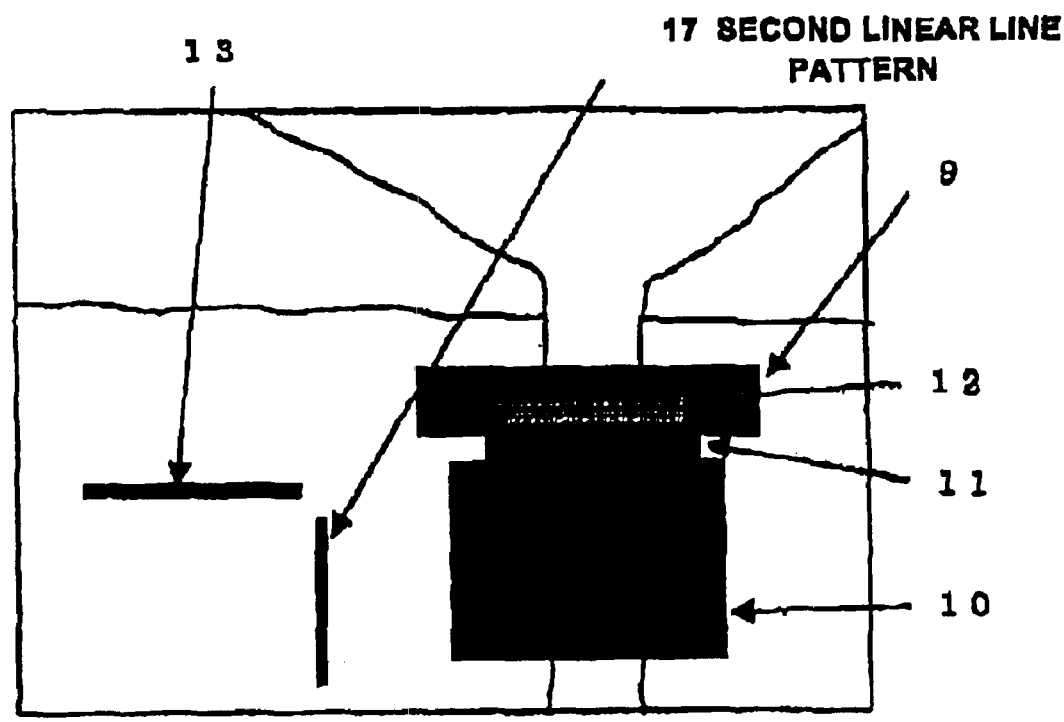
FIG. 9 shows a state in which two linear line patterns are formed.

In accordance with another embodiment of the present invention, a second linear configuration processing line (hereafter referred to as a "second linear line pattern") 17 that is orthogonal to the linear line pattern 13 is additionally formed on the sample. FIG. 9 shows a second linear line pattern forming state in which the second linear line pattern 17 in formed. Since the linear line pattern 13 and the second linear line pattern 17 extend in directions orthogonal to each other, irradiation positions of the focused ion beam a in directions perpendicular to the linear line pattern 13 and the second linear line pattern 17 may be measured such that correction of drifts of the beam irradiation positions on an orthogonal coordinate system can be conducted. When processings in the deposition processing frame 9, the rough processing frame 10, the intermediate processing frame 11 and the finish processing frame 12 are performed, using drift correction values obtained on the orthogonal coordinate system, the processings can be performed in a state in which drifts are corrected in two orthogonal directions with respect to sections to be processed.

In accordance with the present invention, an operator of the focused ion beam apparatus may designate only a position of a cross section to be formed, or set a series of processing frames, and all processings to form the cross section can be executed with a high level of accuracy in at least one direction with respect to the cross section surface.

The linear line processing in accordance with the present invention that is performed at the start of a series of processings can be finished in a short time. As a result, highly accurate processings can be realized in at least one direction with respect to the cross section surface with a slight increase in the waiting time.

In a TEM sample formation and a cross section formation, a required level of drift correction accuracy differs depending on directions with respect to surfaces to be processed. Accordingly, by performing a linear line processing in accordance with the present invention in a direction in which the highest level of accuracy is required, an optimum, highly accurate processing can be realized.

In a TEM sample processing, a thin film having a thickness of about 0.1 micron may need to be left. If a drift occurs in a direction perpendicular to the thin film, the thin film may be eliminated or may become thicker than a presumed film thickness. However, in accordance with the present invention, drifts in a direction perpendicular to the thin film can be readily and accurately corrected, such that the success rate in TEM sample processings is substantially improved.

Furthermore, two linear line patterns that extend in directions mutually orthogonal to each other may be used in accordance with another embodiment of the present invention. Drifts in two orthogonal directions can be highly accurately corrected, and therefore highly accurate processings can be realized.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method for correcting a beam irradiation position during processing in a focused ion beam apparatus, the method comprising:
   a first step of forming a linear line pattern on a sample by linearly irradiating a focused ion beam on a sample at a location removed from a processing region to be processed by irradiation of the focused ion beam;
   a second step of measuring a position of the linear line pattern in a direction perpendicular to the linear line pattern before processing;
   a third step of measuring at least once a position of the linear line pattern in a direction perpendicular to the linear line pattern;
   a fourth step of detecting a drift of the position of the linear line pattern measured by the third step in the direction perpendicular to the linear line pattern with respect to the position measured by the second step or the previously measured position; and
   a fifth step of correcting the beam irradiation position of the focused ion beam based on the drift detected in the fourth step and processing the processing region.

2. A method according to claim 1, wherein the linear line pattern is composed of a linear line segment that extends in a direction extending in parallel with a surface of a section to be processed.

3. A method according to claim 1, wherein the second step comprises the step of measuring first brightness changing positions along the linear line pattern from one side of the linear line pattern in one direction perpendicular to an the linear line pattern, and second brightness changing positions along the linear line pattern from another side of the linear line pattern in another direction perpendicular to the linear line pattern.

4. A method according to claim 3, further comprising the step of obtaining an average position of the first and second brightness changing positions measured.

5. A method according to claim 4, wherein the average position is obtained as a center position of the linear line pattern in the direction perpendicular to the linear line pattern.

6. A method according to claim 5, wherein, in the third step, the beam irradiation position of the focused ion beam in the direction perpendicular to the linear line pattern is measured in a plurality of times.

7. A method according to claim 6, wherein the fourth step comprises the step of obtaining the drift of the positions of the linear line pattern in the direction perpendicular to the linear line pattern in two consecutive measurements of the positions.

8. A method for correcting a beam irradiation position in a focused ion beam apparatus, the method comprising the steps of:
   defining on a sample at least one processing region for conducting fine processing by irradiating a focused ion beam;
   forming a first linear line pattern on the sample by linearly irradiating a focused ion beam on the sample at a location that does not overlap a position of the at least one processing region;
   measuring first brightness changing positions along the first linear line pattern from one side of the first linear line pattern in one direction perpendicular to of the first linear line pattern, and second brightness changing positions along the first linear line pattern from another side of the first linear line pattern in another direction perpendicular to of the first linear line pattern;
   obtaining a first average position of the first and second brightness changing positions measured in one direction perpendicular to the first linear line pattern as a position of the first linear line pattern in a direction perpendicular to the first linear line pattern before processing;
   obtaining at least once the first average position in a direction perpendicular to the first linear line pattern during processing of the processing region;
   detecting a drift in the first average position of the focused ion beam in the direction perpendicular to the first linear line pattern compared to the first average position obtained previously; and
   correcting the beam irradiation position of the focused ion beam with respect to at least one processing region based on the drift detected when processing the processing region.

9. A method according to claim 8, wherein the first linear line pattern is composed of a linear line segment that extends in a direction extending in parallel with a surface of a section to be finally processed in the fine processing.

10. A method according to claim 8, wherein the step of forming the first linear line pattern on the sample is automatically started when the fine processing is started.

11. A method according to claim 8, further comprising the steps of
    forming on the sample a second linear line pattern extending in a direction perpendicular to the first linear line pattern;
    measuring first brightness changing positions along the second linear line pattern from one side of the second linear line pattern in one direction perpendicular to an extension direction of the second linear line pattern, and second brightness changing positions along the second linear line pattern from another side of the second linear line pattern in another direction perpendicular to the extension direction of the second linear line pattern;
    obtaining a second average position of the first and second brightness changing positions measured along the second linear line pattern; and
    correcting drifts in the beam irradiation position of the focused ion beam in two directions orthogonal to each other based on the first average position and the second average position.

12. A method according to claim 8, wherein the first average position is obtained at least two times.

13. A method according to claim 12, wherein the step of detecting the drift comprises obtaining a difference in the average position obtained in the at least two times of obtaining the average position.

14. A method according to claim 13, wherein the beam irradiation position of the focused ion beam is corrected in the direction perpendicular to the first linear line pattern with respect to the at least one processing region based on the drift.

15. A method according to claim 8, wherein the fine processing is performed with a plurality of different sample irradiation beam current conditions.

16. A method according to claim 15, wherein the beam irradiation position of the focused ion beam is measured when one of the different sample irradiation beam current conditions is changed to another of the different sample irradiation beam current conditions.

17. A method according to claim 16, wherein a difference between the beam irradiation positions before and after one of the sample irradiation beam current conditions is changed is obtained, and the beam irradiation position of the measured under the another of the different sample irradiation beam current conditions is corrected based on the difference only in the direction perpendicular to the first linear line pattern.

18. A method according to claim 15, wherein the beam irradiation position of the focused ion beam is measured each time the plurality of different sample irradiation beam current conditions are switched from one to another.

19. A focused ion beam apparatus, comprising:

an ion beam source that generates an ion beam;

an ion lens that focuses the ion beam into a focused ion beam;

a scanning device that scans the focused ion beam on a specified processing region on a sample surface;

a component that defines on the sample at least one processing region for conducting a fine processing by irradiating the focused ion beam;

a component that forms a linear line pattern on the sample by linearly irradiating a focused ion beam on the sample at a location that does not overlap the least one processing region;

a component that measures first brightness changing positions along the linear line pattern from one side of the linear line pattern in one direction perpendicular to the linear line pattern, and second brightness changing positions along the linear line pattern from another side of the linear line pattern in another direction perpendicular to the linear line pattern;

a component that obtains an average position of the first and second brightness changing positions measured;

a component that obtains the average position before or in the process;

a component that detects a drift in the beam irradiation position of the focused ion beam in the direction perpendicular to the linear line pattern based on a drift of the average position; and a component that corrects the beam irradiation position of the focused ion bean based on the drift detected with respect to at least one processing region.

* * * * *